US007102457B1

(12) United States Patent
Tsironis

(10) Patent No.: US 7,102,457 B1
(45) Date of Patent: Sep. 5, 2006

(54) MECHANICALLY BALANCED MICROWAVE LOAD PULL TUNER

(76) Inventor: Christos Tsironis, 44 Cavibou Cr., Kirkland, Québec (CA) H9J 2H8

( * ) Notice: Subject to any disclaimer, the term of this patent is extended or adjusted under 35 U.S.C. 154(b) by 115 days.

(21) Appl. No.: 10/818,126

(22) Filed: Apr. 6, 2004

(51) Int. Cl.
*G01R 31/26* (2006.01)
*G01R 27/04* (2006.01)
*G01R 27/32* (2006.01)
*H01P 1/00* (2006.01)

(52) U.S. Cl. .................. 333/17.1; 333/17.3; 333/263; 324/613; 324/642

(58) Field of Classification Search ............... 333/17.1, 333/17.3, 263; 324/613, 642
See application file for complete search history.

(56) References Cited

U.S. PATENT DOCUMENTS 6,297,649 B1 * 10/2001 Tsironis ....................... 324/642
6,515,465 B1 * 2/2003 Kiyokawa et al. ......... 324/76.49
6,674,293 B1 * 1/2004 Tsironis ....................... 324/638
2003/0132759 A1 * 7/2003 Tsironis ....................... 324/601

FOREIGN PATENT DOCUMENTS

JP         11-6855       * 1/1999
JP      2001-33512       * 2/2001

OTHER PUBLICATIONS

Christos Tsironis, "System Performs Active Load-Pull Measurements", Microwaves & RF, Nov. 1995, p. 102-108.

* cited by examiner

*Primary Examiner*—Barbara Summons

(57) ABSTRACT

A mechanically balanced automatic microwave tuner is used in on-wafer device testing. Using low loss rigid airlines to connect the tuner and the devices improves the tuning range at the DUT reference plane but causes mechanical movements of the wafer probes, when the tuner mobile carriage moves horizontally. Balancing the tuner by means of exactly positioned and dimensioned mobile counterweights, driven by the same mechanism as the tuner carriage itself, allows for compensation of the probe movement and safe on wafer operation.

5 Claims, 9 Drawing Sheets

MECHANICALLY BALANCED MICROWAVE LOAD PULL TUNER

PRIORITY CLAIM

Not Applicable

CROSS-REFERENCE TO RELATED ARTICLES

[1] Tsironis, C. "System Performs Active Load-Pull Measurements", Microwaves & RF, November 1995, page 102–108.

STATEMENT REGARDING FEDERALLY SPONSORED RESEARCH OR DEVELOPEMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to a method used to compensate the tilting of electro-mechanical microwave tuners employed in on-wafer measurement operations by incorporating a balancing counterweight inside the tuners.

Modern design of high power microwave amplifiers and oscillators, used in various telecommunication systems, requires accurate knowledge of the active device's (microwave transistor's) characteristics. In such circuits, it is inadequate for the transistors, which operate in their highly non-linear regime, close to power saturation, to be described using non-linear numeric models only.

Further on designing low noise amplifiers for communication systems requires exact knowledge of the noise parameters of microwave transistors to be used in the amplifiers; these can be obtained only by characterizing the microwave transistors such as to determine their noise parameters.

A popular method for testing and characterizing such microwave components (transistors) in the small signal (low noise) and in the non-linear (high power) regions of operation is "source pull" and "load pull". Source and Load pull are measurement techniques employing microwave tuners and other microwave test equipment. The microwave tuners are used in order to manipulate the microwave impedance conditions under which the Device Under Test (DUT, or transistor) is tested (FIGS. 1 and 2).

There are essentially two types of microwave tuners allowing generating and manipulating microwave impedances presented to the DUT: A. Electro-mechanical or passive electronic tuners, leading to "passive source or load pull" for low noise (FIG. 1) and high power characterization (FIG. 2); and; B. Active tuners, leading to "active load pull" for high power characterization only [1]. In this invention, we deal only with passive electro-mechanical tuners [FIG. 3].

A typical noise measurement system (FIG. 1) includes a noise source (3), a source tuner (4), a test fixture housing the DUT (5) and a low noise receiver (6). The tuner and the overall test system are controlled by a control computer (1), which is connected to the tuner by a control cable (2). Through digital commands from the computer (1) the tuner's motors are positioned appropriately and create impedances, which allow to characterize the DUT.

A typical load pull measurement system (FIG. 2) includes a signal source (9), a source tuner (10), a test fixture housing the DUT (11), a load tuner (12) and a power meter (13). The tuners and the overall test system are controlled by a control computer (7), which is connected to the tuners by a control cables (8, 14). Through digital commands from the computer (7) the tuner's motors are positioned appropriately and create impedances, which allow to characterize the DUT.

Electro-mechanical slide screw tuners, compared to electronic tuners or active load pull tuners, have a number of advantages like long-term stability, higher handling of microwave power, much easier operation and lower cost. Such tuners [FIG. 3] use adjustable mechanical obstacles (probes or slugs) (15) inside the transmission media of the tuners, made using a slotted coaxial or parallel plate airline (slabline) (16), in order to reflect part of the power coming out of the DUT (device under test) and create this way adjustable microwave impedances presented to the DUT in order to perform the corresponding tests.

Electro-mechanical tuners comprise a solid housing (17), a low loss transmission media for microwave energy (slotted transmission line or slabline) (16) with an input or test port (18), and an output or idle port (19), a moving carriage (20) holding one or two microwave probes (15) and electrical motors ensuring the horizontal and vertical movement of the probe (15).

Inserting the microwave probe(s) (15) into the transmission line (16) is accomplished by the moving carriage (20) and controls the amplitude of the microwave reflection factor;

The moving carriage must provide for a very accurate vertical positioning of the probe(s) (15), since the amplitude of the reflection factor generated by the tuner is very sensitive on the distance between the probe(s) and the central conductor of the transmission airline (16) (capacitive coupling).

The said moving carriage (20) contains one or two stepper motors (62) in FIG. 7 and associated reducing gear in order to position one or two probes closely to the central conductor of the airline's central conductor; this makes the moving carriage (20, FIG. 3), (61, FIG. 6), (63, FIG. 7) quite heavy; typical mass of such a carriage is between 0.8 and 1 kg.

Horizontal movement of the probe along the transmission lines (68, 69) controls the phase of the microwave reflection factor; both horizontal and vertical movements together generate complex reflection factors within the tuning range of the tuner. The tuning range of the tuner is limited by its capability to generate high reflection factors by placing the probe close to the center conductor of the transmission airline and by its total length: in order to cover a 360° circle on the Smith Chart the free horizontal travel of the carriage (20) must be one half of a wavelength at the frequency of operation; for example at 1 GHz the free travel must be 15 cm, at 2 GHz 7.5 cm etc.

A full noise or load pull characterization of transistors on wafer in this and lower frequency range requires the tuner carriage (20) to move horizontally over lengths of this order of magnitude. It is during this operation that the problems appear that this invention aims to solve.

Reflection factors presented to the DUT are determined by two factors: A) the maximum tuning range (reflection factor amplitude) of the tuners and B) the insertion loss of the RF connection link (21) between tuner and DUT, which reduces the said reflection factor by twice the loss of said RF connection link.

In order to present the device under test with the highest possible reflection factor during load pull or noise measurements, the best possible method to reduce the insertion loss of the RF connection link (21) between tuner and DUT is to use low loss transmission airlines. The said low loss transmission airlines are best configured with a 30° or 45° angle, in order to fit perfectly to the micro-probes (22) used for the on-wafer testing (bent airlines (21)).

Alternative solutions, like semi rigid or flexible RF cables represent an inferior solution, because their core is filled with some dielectric material, like Teflon, and produces higher insertion loss at microwave frequencies, thus reducing the available power (and by consequence the reflection factor) that can be presented to the DUT by the tuners.

The said low loss bent airlines though, create a rigid mechanical link between the tuner (17) and the micro-probes (22). For on-wafer measurements using solid bent airlines, a microwave tuner needs to be mounted on a 3-axis positioner (26, 27, FIG. 3). Any mechanical movement inside the tuners, created either by the stepper motors or the movement of the tuner carriages will be translated to the probes and creates a vertical probe movement of several dozens of micrometers (23, 24). Considering that the contact pads on a wafer device under test (chip)(25) have typical dimensions of 100 m to 200 m, it is obvious that even a small mechanical movement of the probes may easily damage the DUT contact pads.

In order to avoid the vertical movement of the tuners and by consequence of the wafer probes the tuners must be 'balanced' whatever the actual position of the carriage is inside the tuner carriage.

It is the object of this invention to describe such mechanisms of movement compensation (or 'balancing').

BRIEF SUMMARY OF THE INVENTION

In order to solve the problems referred to in 'BACKGROUND OF THE INVENTION', we propose the following solution:

To incorporate, inside or on top of the tuner enclosure, a mobile counterweight, horizontally moving equally to and in opposite direction of the tuner carriage, in order to maintain the center of gravity constant and compensate for any vertical movement (tilting) of the tuner that is caused by the moving tuner carriage.

DETAILED DESCRIPTION OF THE INVENTION

The concept of a balancing counterweight is well established in moving mechanical constructions, like cranes etc., which are not allowed to tilt and, eventually, fall. The balancing counterweight has to move synchronically and in opposite direction with the load, in order to keep the center of gravity of the whole structure constant.

Figure 1:
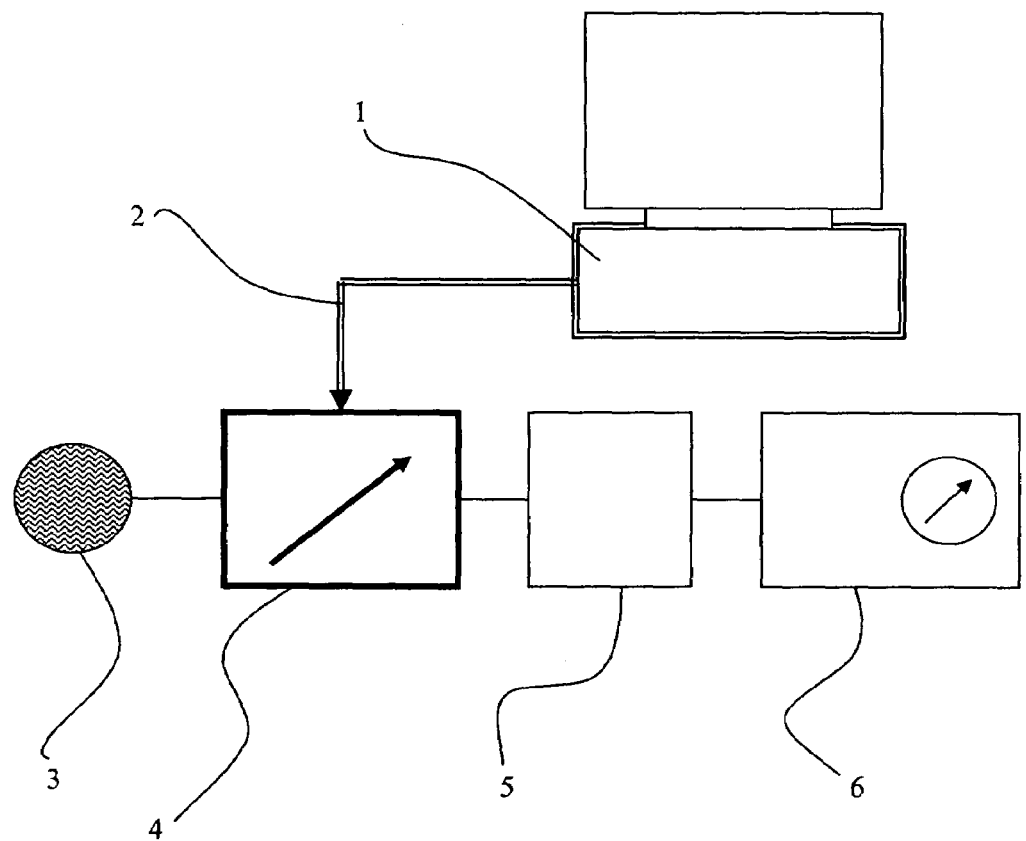
FIG. 1 (Prior Art) depicts a block diagram of a noise measurement setup, in which automatic microwave tuners are being used.
Figure 2:
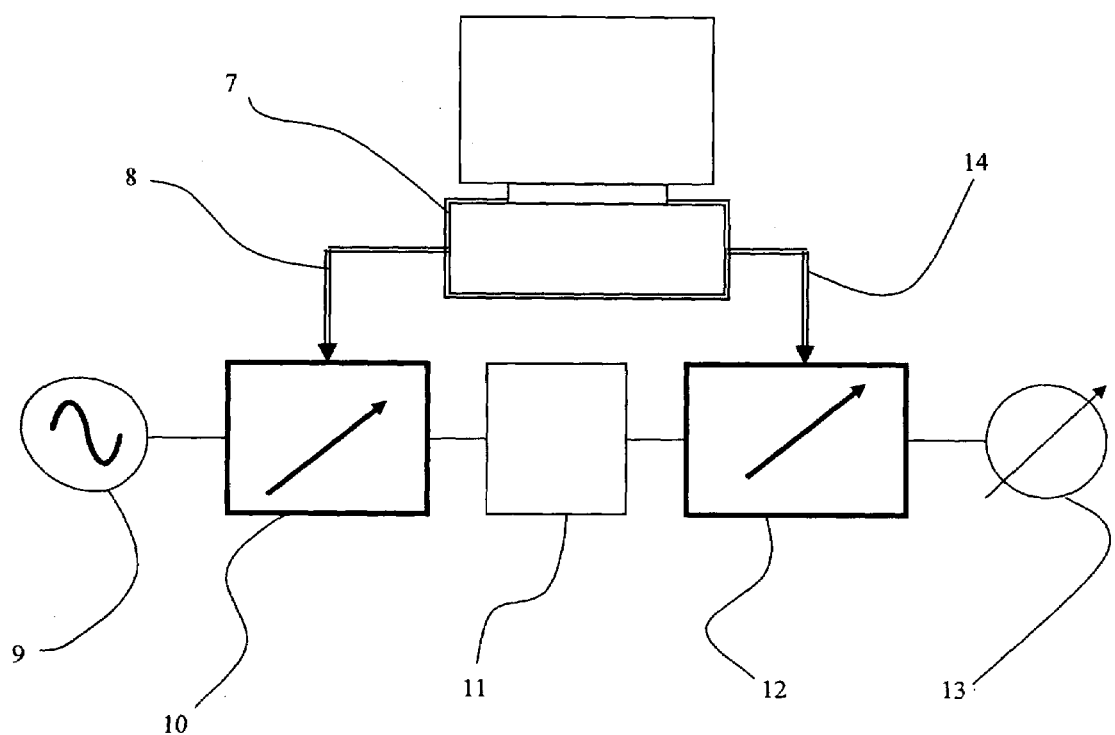
FIG. 2 (Prior Art) depicts a block diagram of a load pull measurement setup, in which automatic microwave tuners are being used.
Figure 3:
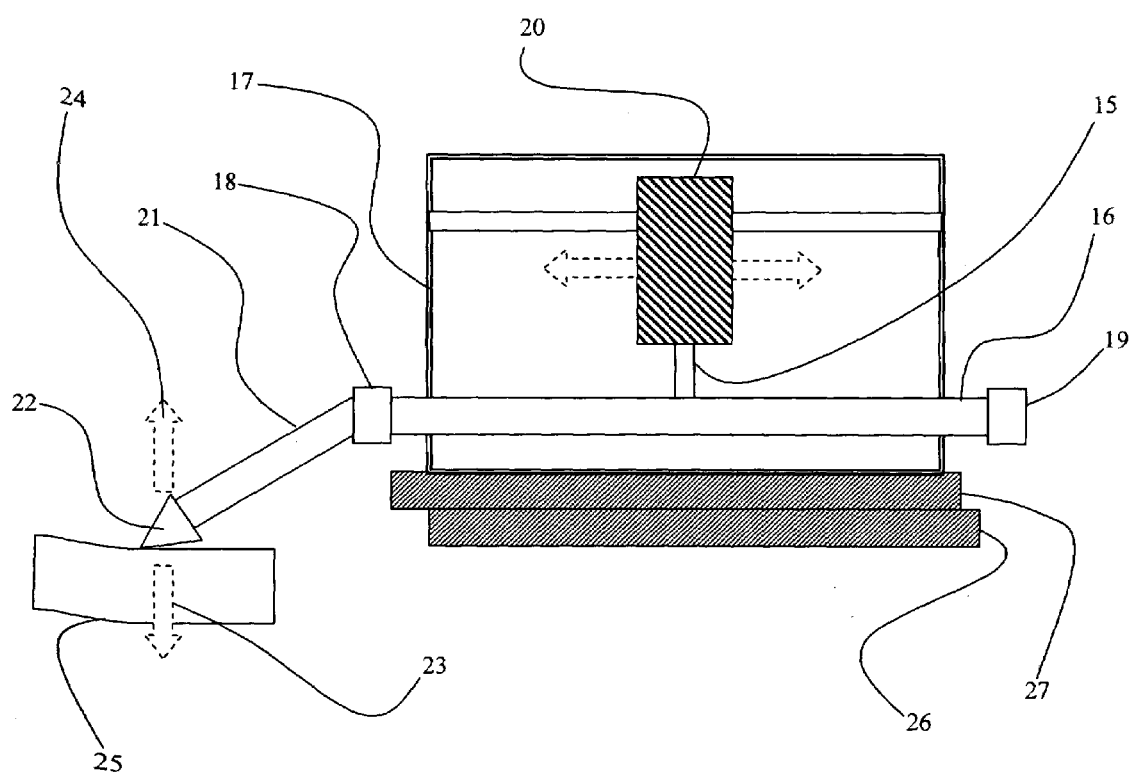
FIG. 3 (Prior Art) depicts a schematic cross section of the moving mechanism of an automatic microwave tuner, assembled and mounted for on-wafer testing.

In the case of an electro-mechanical microwave tuner, as shown in FIG. 3, the cause of un-balance and 'tilting' is the massive horizontally movable carriage (20), which holds and controls the vertical movement of the RF probe, which is inserted in and out of the slotted transmission airline of the tuner, and also moves along the airline from one end of the tuner to the other.

Figure 4:
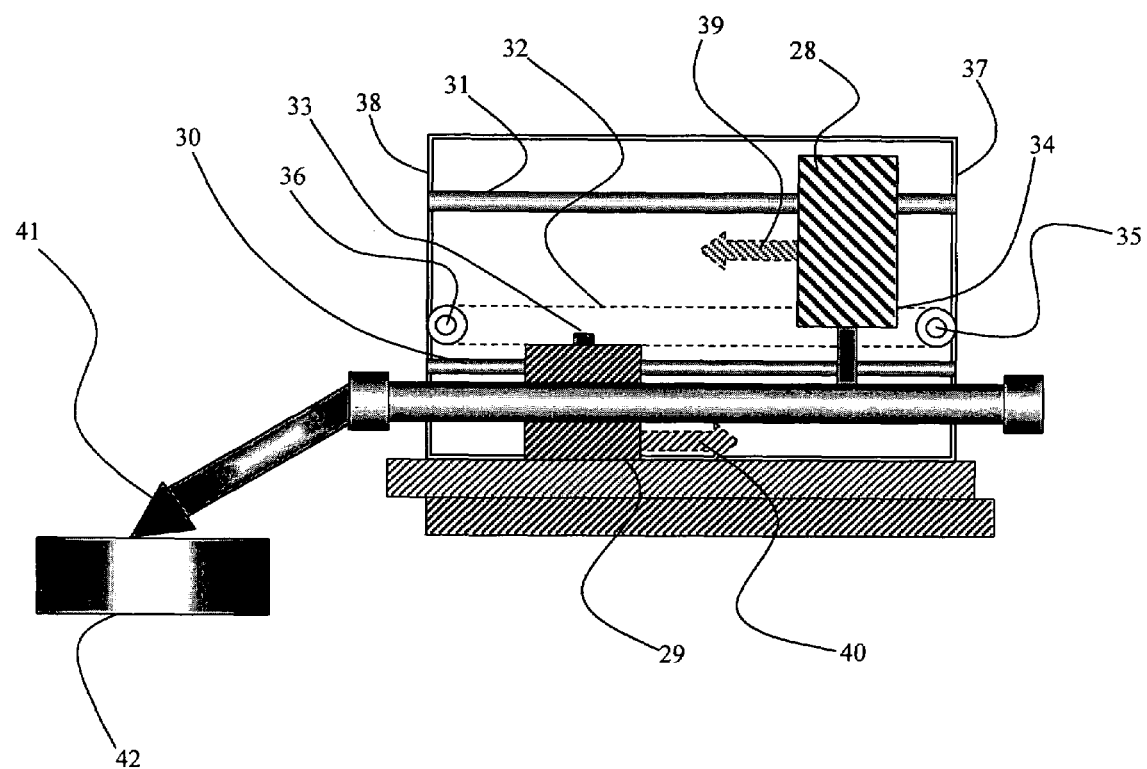
FIG. 4 depicts an automatic microwave tuner balanced for vertical tilting, using a mobile counterweight, placed inside the tuner enclosure.
Figure 7:
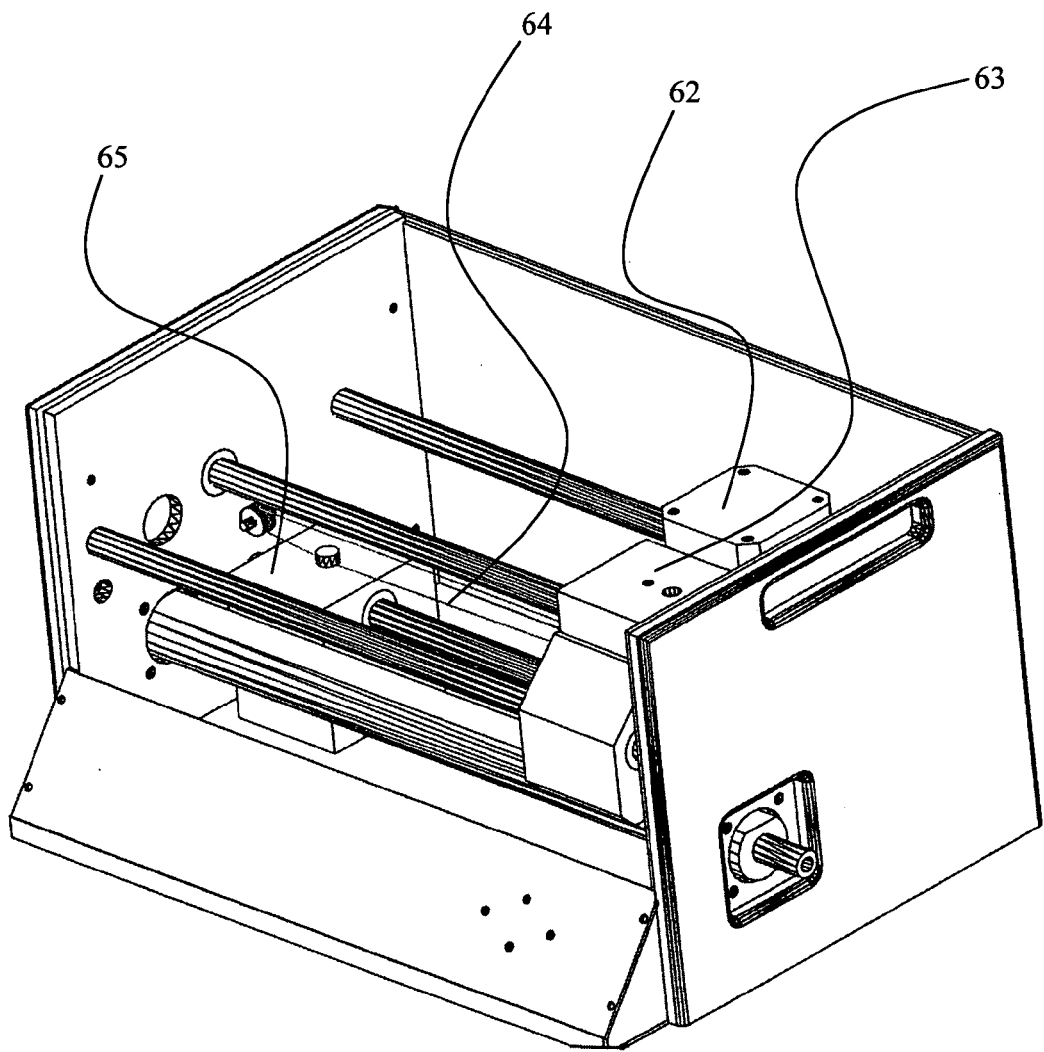
FIG. 7 depicts a perspective view of an automatic microwave tuner comprising a mobile counterweight, placed inside the tuner enclosure.

The mobile tuner carriage (20 in FIG. 3, 28 in FIG. 4) in FIG. 4 comprises a vertical stepper motor (62, FIG. 7), a high precision vertical axis, an anti-backlash mechanism and a translation mechanism, the total being housed inside a solid enclosure (63, FIG. 7). All these precision components are contributing to a considerable weight, which, in our case, is close to 1.0 kg.

Figure 5:
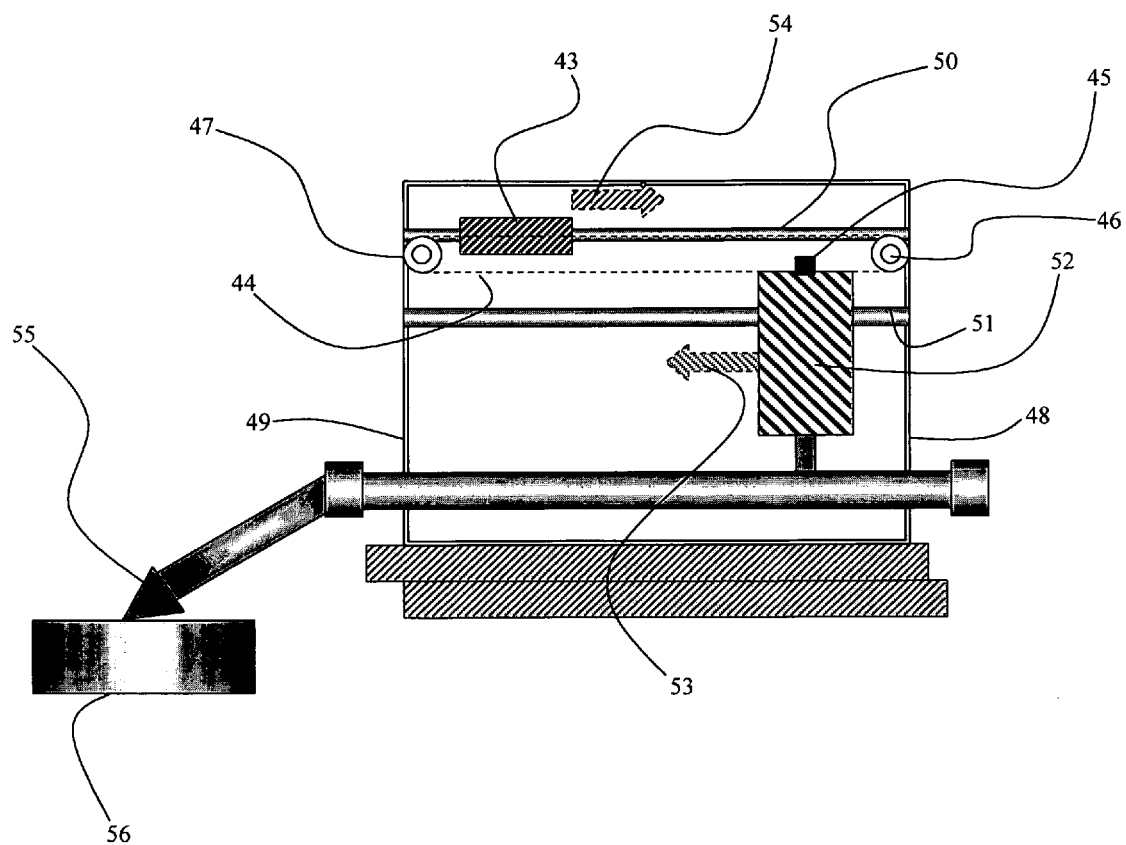
FIG. 5 depicts an automatic microwave tuner balanced for vertical tilting, using a mobile counterweight, placed on top of the tuner body.

The balancing counterweight can be placed inside the tuner enclosure [FIG. 4] or on top of it [FIG. 5].

The balancing counterweight (29 in FIG. 4, 43 in FIG. 5) must be placed strategically correct, so it can slide freely along the horizontal axis (30 in FIG. 4, 50 in FIG. 5) of the tuner and be easily driven by the moving carriage itself, and not via an additional auxiliary mechanism, which may add backlash and lag synchronization of movement.

Lateral guides (30, 50), running perfectly parallel with the main horizontal guides (31, 51) of the movable tuner carriage, are needed in order to allow the balancing counterweight to move freely and synchronically with the tuner carriage (28, 52).

In the case of FIG. 4 position control of the counterweight is established by using a string (32) attached to the top of the counterweight itself (33) and to the lower part, or bottom (34), of the mobile tuner carriage (28). The string (32) rolls over two pulleys (35, 36), which are permanently attached to the vertical walls (37, 38) of the tuner enclosure, which forces the counterweight to follow and move only when the carriage moves. The counterweight is sliding on horizontal bars (30), which are mounted perfectly parallel to the sliding bars (guides) of the mobile carriage (28) itself. Sliding of the mobile counterweight is facilitated using sliding bearings, such as Teflon coated bearings.

When the carriage moves to the left (39), the mobile counterweight automatically and synchronically moves in the opposite direction (40). This ensures, that the center of gravity of the whole tuner is not moving, and thus the tuner does not 'tilt'. By consequence the probe (41) contact on the wafer (42) is stable.

In the case of FIG. 5 position control of the mobile counterweight (43) is established by using a string (44) attached to the center of the counterweight itself (43) and to the top of the mobile tuner carriage (45). The string (44) rolls over two pulleys (46, 47), which are permanently attached to the vertical walls (48, 49) of the tuner enclosure.

So it is the movement of the carriage, which forces the counterweight to follow and move only when and exactly as far as the carriage moves. The mobile counterweight is sliding on horizontal bars (50), which are mounted perfectly parallel to the sliding bars (guides) (51) of the tuner carriage itself. Sliding of the mobile counterweight is facilitated using sliding bearings, such as Teflon coated bearings.

When the carriage (52) moves to the left (53), the mobile counterweight (43) moves in the opposite direction (54). This ensures, that the center of gravity of the whole tuner is not moving, and thus the tuner does not "tilt". By consequence the probe (55) contact on the wafer (56) is stable.

Figure 6:
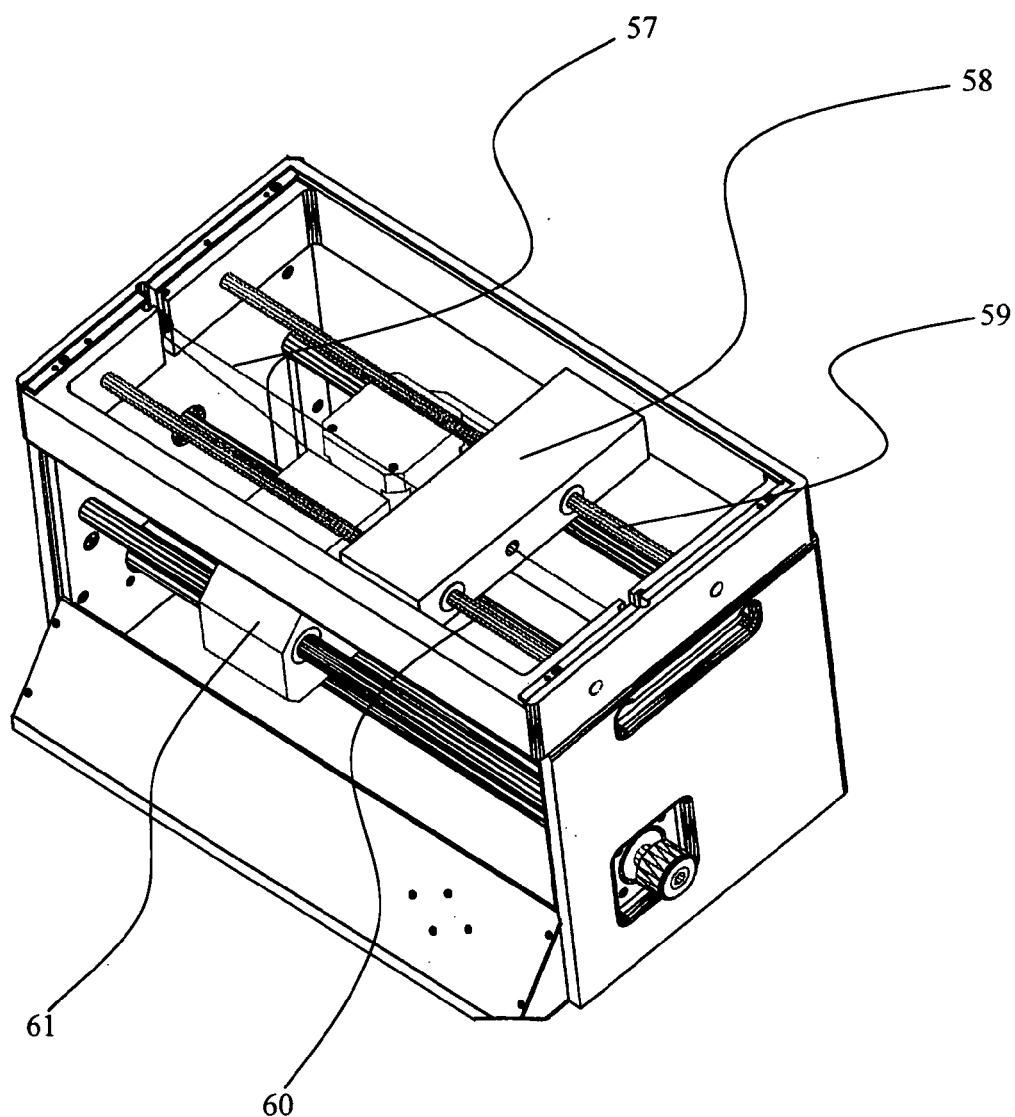
FIG. 6 depicts a perspective view of an automatic microwave tuner comprising a mobile counterweight, placed on top of the tuner body.

FIG. 6 shows a perspective view of a load pull tuner, as described before, with a mobile carriage (61) and a balancing counterweight (58), which slides on two horizontal guides (59, 60) and is driven by a string (57), which is attached also to the top of the mobile carriage (61).

FIG. 7 shows a perspective view of a load pull tuner, as described before, with a mobile carriage (63) and a balancing counterweight (65), moving inside the tuner enclosure, driven by a string (64) attached to the bottom of the carriage (63).

Figure 8:
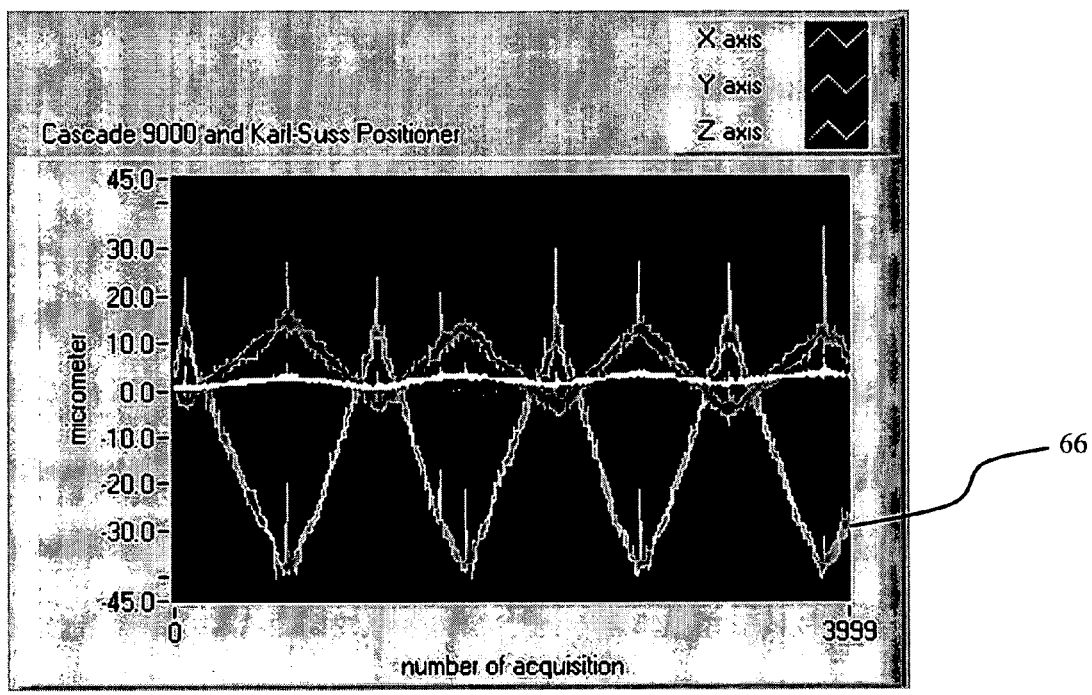
FIG. 8 depicts measured movement (tilting) of an automatic tuner without use of a balancing counterweight.

FIG. 8 shows measured results of an 'unbalanced' load pull tuner, as in FIG. 3. Trace (66) shows the vertical movement of the wafer-probe (22) in FIG. 3, measured during several full horizontal swings of the tuner. One full wave of trace (66) corresponds to one forth-and-back travel of the unbalanced tuner carriage (20). The total vertical movement amounts to about 60 micrometers.

Figure 9:
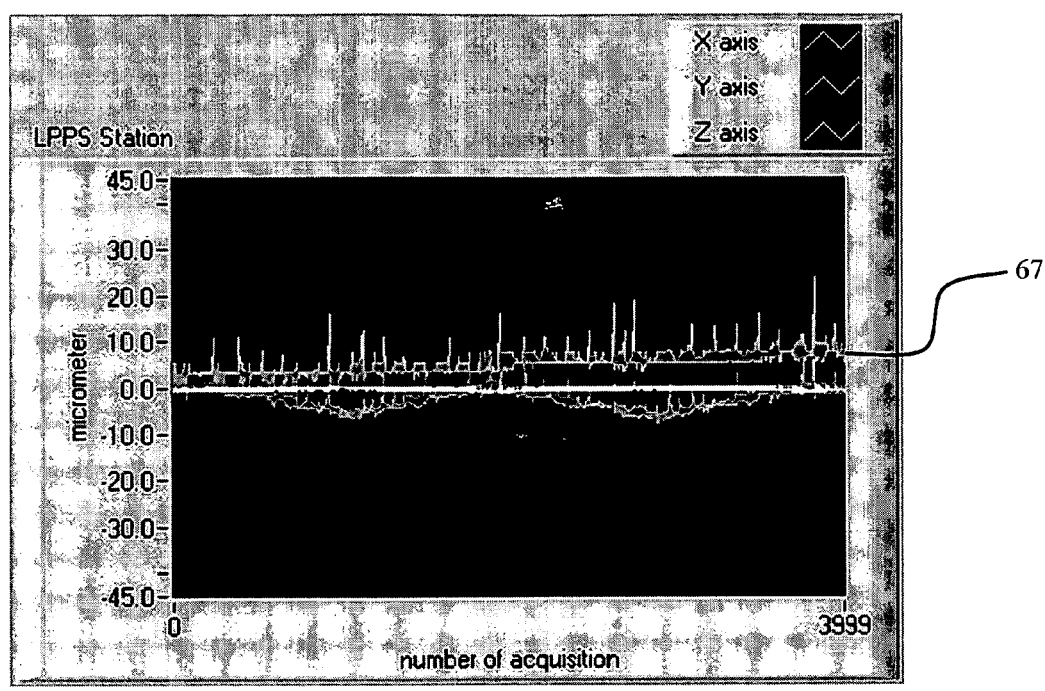
FIG. 9 depicts measured movement of an automatic tuner when a balancing counterweight is used.

FIG. 9 shows measured results of a 'balanced' load pull tuner, as in FIG. 4. Trace (67) shows the vertical movement of the wafer-probe (41) in FIG. 4, measured during several full horizontal swings of the tuner. One full wave of trace (67), albeit almost indiscernible, corresponds to one forth-and-back travel of the tuner carriage (28). The total lift amounts to about 5 micrometers. Both horizontal and vertical scales in FIGS. 8 and 9 are identical.

In conclusion, it is obvious that a balancing counterweight greatly improves the stability of electro-mechanical tuners during on-wafer load pull testing.

What I claim as my invention is:

1. An automatic electro-mechanical microwave tuner comprising a test port, an idle port, a slotted transmission airline joining the two ports, a horizontal remotely controlled movement mechanism, which controls the position of a horizontally movable carriage, which carries a motorized vertical axis, which axis holds a microwave probe insertable into the slotted airline; the said tuner comprises mechanical components and configurations allowing it to incorporate and handle a horizontally movable counterweight.

2. An automatic electro-mechanical microwave tuner, as in claim 1, comprising a horizontally movable counterweight mounted on and sliding along horizontal guides on top of the tuner enclosure and having the same mass as the tuner carriage itself and being attached to the carriage in a manner as to move synchronically and in the opposite direction of and being driven by the movement of the carriage itself.

3. An automatic electro-mechanical microwave tuner, as in claim 1, comprising a horizontally movable counterweight mounted on and sliding along horizontal guides and inserted inside the tuner enclosure and having the same mass as the tuner carriage itself and being attached to the carriage in a manner as to move synchronically and in the opposite direction of and being driven by the movement of the carriage itself.

4. An automatic electro-mechanical microwave tuner, as in claim 2, and an extended and bent airline at its test port, which bent airline is connected to a microwave wafer probe.

5. An automatic electro-mechanical microwave tuner, as in claim 3, and an extended and bent airline at its test port, which bent airline is connected to a microwave wafer probe.

\* \* \* \* \*